United States Patent [19]

Kalb et al.

[11] Patent Number: 5,760,662
[45] Date of Patent: Jun. 2, 1998

[54] METHODS AND APPARATUS FOR IMPROVING FREQUENCY RESPONSE OF INTEGRATED RC FILTERS WITH ADDITIONAL GROUND PINS

[75] Inventors: Jeffrey Clifford Kalb, Saratoga; Peruvamba Hariharan, Milpitas; Anguel Svilenov Brankov, San Jose, all of Calif.

[73] Assignee: California Micro Devices Corporation, Milpitas, Calif.

[21] Appl. No.: 608,433

[22] Filed: Feb. 28, 1996

[51] Int. Cl.$^6$ .................................................. H03J 1/02
[52] U.S. Cl. ................................................ 333/172; 257/691
[58] Field of Search .......................... 333/172; 257/691

[56] References Cited

U.S. PATENT DOCUMENTS

| | | | |
|---|---|---|---|
| 3,775,838 | 12/1973 | Dalmasso | 437/209 |
| 4,937,660 | 6/1990 | Dietrich et al. | 257/750 |
| 5,338,974 | 8/1994 | Wisherd et al. | 257/691 |
| 5,355,014 | 10/1994 | Rao et al. | 257/533 |
| 5,370,766 | 12/1994 | Desaigoudar et al. | 437/60 |
| 5,493,259 | 2/1996 | Blalock et al. | 333/182 |
| 5,495,387 | 2/1996 | Mandai et al. | 333/172 X |
| 5,514,612 | 5/1996 | Rao et al. | 437/51 |

*Primary Examiner*—Robert Pascal
*Assistant Examiner*—Justin P. Bettendorf
*Attorney, Agent, or Firm*—Beyer &Weaver, LLP.

[57] ABSTRACT

A Quarter Size Small Outline Packages (QSOP) integrated resistor/capacitor network. The QSOP integrated resistor/capacitor network includes resistor/capacitor filters implemented in a QSOP package in integrated form. In one embodiment, the QSOP integrated resistor/capacitor network includes at least six ground pins for coupling capacitors of the resistor/capacitor filters with a common ground to maximize the attenuation of ultra-high frequency signals filtered through the resistor/capacitor filters.

20 Claims, 15 Drawing Sheets

METHODS AND APPARATUS FOR IMPROVING FREQUENCY RESPONSE OF INTEGRATED RC FILTERS WITH ADDITIONAL GROUND PINS

BACKGROUND OF THE INVENTION

The present invention relates generally to techniques for improving the integrity of integrated resistor/capacitor (IRC) networks. More particularly, the present invention relates to techniques for improving the amplitude versus frequency response (AFR) of IRC networks at ultra-high frequencies, e.g., above 1 GHz.

Resistor/capacitor networks have long been employed as cost-effective frequency filters in electromagnetic interference (EMI) applications, radio frequency interference (RFI) applications, or the like. Traditionally, resistor/capacitor low pass filters are implemented by discrete components on a circuit board. To save space and perhaps to improve performance, designers have employed thin film technologies to implement the resistor/capacitor networks in integrated form. These miniaturized integrated resistor/capacitor networks (IRC) have proven useful in many applications, including portable electronic devices.

In designing integrated resistor/capacitor networks, one of the critical parameters is its amplitude versus frequency response (AFR). The amplitude versus frequency response (AFR) refers to the ability of the integrated resistor/capacitor (IRC) filter to pass signals having frequencies below a certain threshold with minimum attenuation, while increasing the attenuation of signals above a certain threshold. The AFR is important because, for example, in EMI/RFI filtering applications, standards, rules and regulations promulgated by the regulatory bodies, e.g., the Federal Communication Commission (FCC), dictate that electronic devices must be shielded and/or filtered to minimize or attenuate signals having frequencies above a certain threshold frequency limit.

To maximize the attenuation of the frequencies above the threshold frequency limit by the RC filters, actual IRC networks should preferably behave like ideal RC networks. In an ideal RC network, there is no parasitic capacitance, resistance, or inductance associated with the filter. FIG. 1 illustrates the schematic of the ideal RC low-pass filter 102. In the ideal RC filter of FIG. 1, resistors R1 and R2 are typically substantially equal in value and, together with capacitor C, determine the value of the threshold frequency. Although the input terminal and the output terminal are labeled as such for ease of discussion, either terminal 104 or terminal 106 can act as the input terminal with the other acting as the output terminal since ideal RC filters are typically symmetrical.

FIG. 2 shows the relative amplitude (in dB) versus frequency of the ideal RC filter of FIG. 1 with specific values of R1, R2, and C for the frequency range from 0 to 3 GHz. In FIG. 2, the relative amplitude is expressed as 20 log (output/input) versus frequency. Note that at about 3 GHz, the relative amplitude of the output signal is slightly above about −36 dB.

In the real world, integrated RC networks of course do not have the ideal AFR of FIG. 2. To understand the factors that affect the AFR of integrated resistor/capacitor networks, it is useful to take into account the parasitic inductance, resistance, and capacitance contributed both by the semiconductor RC structure as well as by the IC packaging.

FIG. 3 illustrates the equivalent circuit of the IRC that results when ideal RC filter 102 of FIG. 1 is implemented in an integrated circuit package. In addition to ideal RC filter 102, FIG. 3 also shows a parasitic resistor $R_P$, representing the equivalent parasitic resistance associated with the resistance of the semiconductor RC structure. For example, the resistance associated with the bottom plate of the capacitor in the RC semiconductor structure may contribute to the resistance value of parasitic resistor $R_P$.

There are also shown two parasitic capacitors, $C_{P1}$ and $C_{P2}$, representing the parasitic capacitance attributed to the bond pads of the RC network when the network is fabricated on the semiconductor wafer. Parasitic inductance $L_{IN}$ (bond) represents the inductance associated with the bonding wire employed to bond the input pin on the IC package to its associated bonding pad on the semiconductor die that implements the RC filters. Analogously, parasitic inductor $L_{OUT}$ (bond) represents the inductance due to the bonding structure in the package, particularly due to the bonding wire between the output pin and its associated bonding pad on the die.

Inductor $L_{GROUND}$ is a function of the inductance of the bonding wires from the ground pins of the IC package to the grounded leadframe. Parasitic inductor $L_{GROUND}$ and capacitor C of the RC filter act as a tuned circuit. Further, the inductance value associated with parasitic inductor $L_{GROUND}$ appears to be the critical inductance in terms of the high frequency performance of the integrated RC network. To improve the attenuation of the output signal of the integrated RC network, particularly at the ultra-high frequency ranges, the inductance associated with parasitic inductor $L_{GROUND}$ should be substantially minimized or eliminated.

The presence of a large parasitic inductance $L_{GROUND}$ has a detrimental effect on the frequency response of prior art integrated RC networks that are implemented in Quarter Size Small Outline Packages (QSOP). The same package is also referred to as SSOP (Shrink Small Outline Packaging) by JC11 of the Joint Electronic Device Engineering Committee (JDEC) of the Electronic Industry Association (EIA). These QSOP packages, which enjoy wide acceptance in the industry, are known as open-tooling packages since their specifications are well known and equipment for handling, placing, and working with these packages are widely available.

To facilitate discussion, FIG. 4A schematically illustrates a prior art integrated circuit, which implements 8 integrated resistor/capacitor (IRC) filters on a 20-pin QSOP package. In the prior art QSOP IRC, there are a total of four ground pins. They are the four corner pins of the QSOP package, i.e., pins 1, 10, 11, and 20. Each of pins 2, 3, 4, 5, 6, 7, 8, and 9 is employed as a terminal for an RC filter. The other terminal of the corresponding filters is implemented by one of respective opposite pins 19, 18, 17, 16, 15, 14, 13, and 12. Note that the capacitors of these integrated RC networks are coupled to the common ground plane, which is coupled to the ground pins 1, 10, 11, and 20.

The frequency response of the integrated RC network of FIG. 4A is shown in FIG. 4B. Because of the existence of the tuned circuit comprising parasitic inductor $L_{GROUND}$ and capacitor C of the RC filter (see FIG. 3), the AFR of FIG. 4B has a point 402 of maximum attenuation. Point 402 may be thought of as the mathematical zero of the AFR. The frequency of this point 402 is called the frequency of maximum rejection. As the value of parasitic inductor $L_{GROUND}$ is reduced, the maximum rejection frequency becomes higher, i.e., point 402 moves to the right on the frequency axis, and results in an improvement of the frequency response at the higher frequency ranges. With reference to FIGS. 4A and 4B, the maximum rejection frequency at test pins 5 and 16 (which together forms an RC filter) is about 915 MHz. The attenuation of the input signal at 3 GHz for this integrated resistor/capacitor network at the above test pins is about 15 dB (point 404 in FIG. 4B). In contrast, if the RC filter had been ideal, the attenuation would have been, as shown in FIG. 2, about 36 dB at 3 GHz.

The 15 dB of attenuation at 3 GHz provided by the prior art IRC has proven to be less than satisfactory for applications involving modern high speed/data devices. By way of example, it is not uncommon nowadays for manufacturers, e.g., those involved in telecommunication and portable telephone applications, to require that integrated resistor/capacitor networks must have an attenuation of no less than about 30 dB at 3 GHz.

In view of the foregoing, what is desired are methods and apparatus for improving the frequency response of integrated resistor/capacitor networks, particularly those implemented in QSOP packages for use at the ultra-high frequency range.

SUMMARY OF THE INVENTION

The invention relates, in one embodiment, to a method for maximizing the attenuation of ultra-high frequency signals filtered through resistor/capacitor filters of an integrated resistor/capacitor network. The integrated resistor/capacitor network is implemented in a QSOP package. The method includes the step of employing at least six pins of the QSOP package as ground pins for the integrated resistor/capacitor network.

In another embodiment, the method relates to a QSOP integrated resistor/capacitor network. The QSOP integrated resistor/capacitor network includes resistor/capacitor filters implemented in a QSOP package in integrated form. In this embodiment, the QSOP integrated resistor/capacitor network includes at least six ground pins for coupling capacitors of the resistor/capacitor filters with a common ground to maximize the attenuation of ultra-high frequency signals filtered through the resistor/capacitor filters.

These and other advantages of the present invention will become apparent upon reading the following detailed descriptions and studying the various figures of the drawings.

Figure 1:
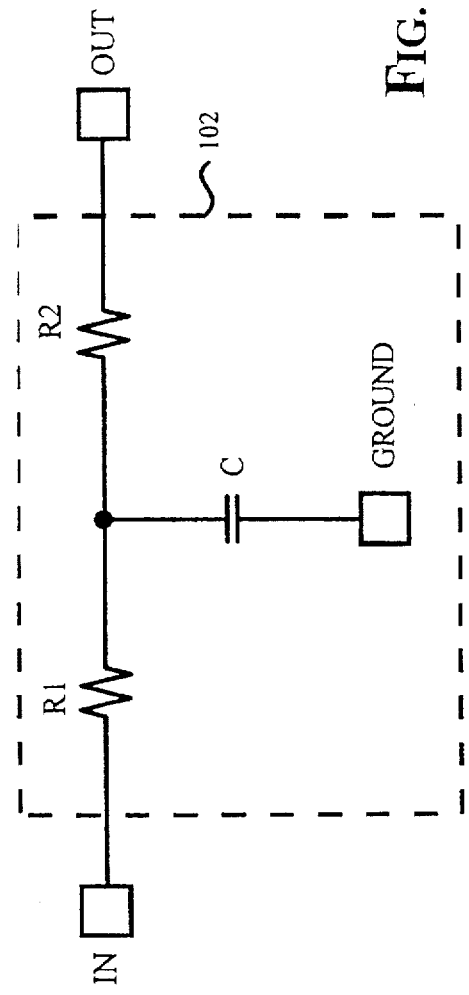
FIG. 1 illustrates the schematic of the ideal RC low-pass filter.
Figure 3:
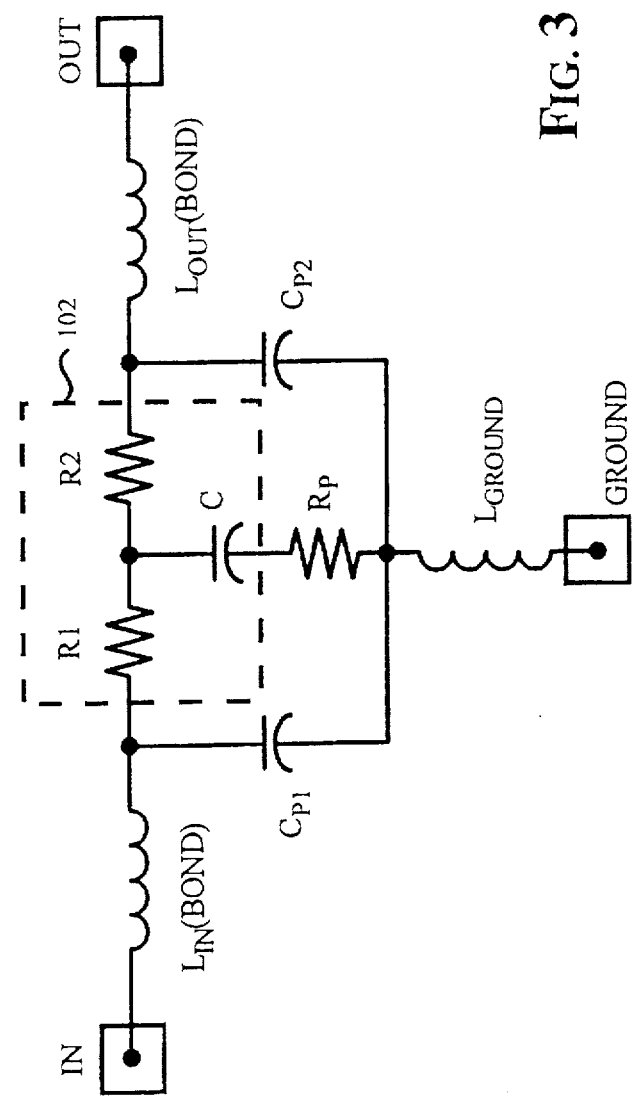
FIG. 3 illustrates the equivalent circuit of the IRC that results when ideal RC filter of FIG. 1 is implemented in an integrated circuit package.
Figure 2:
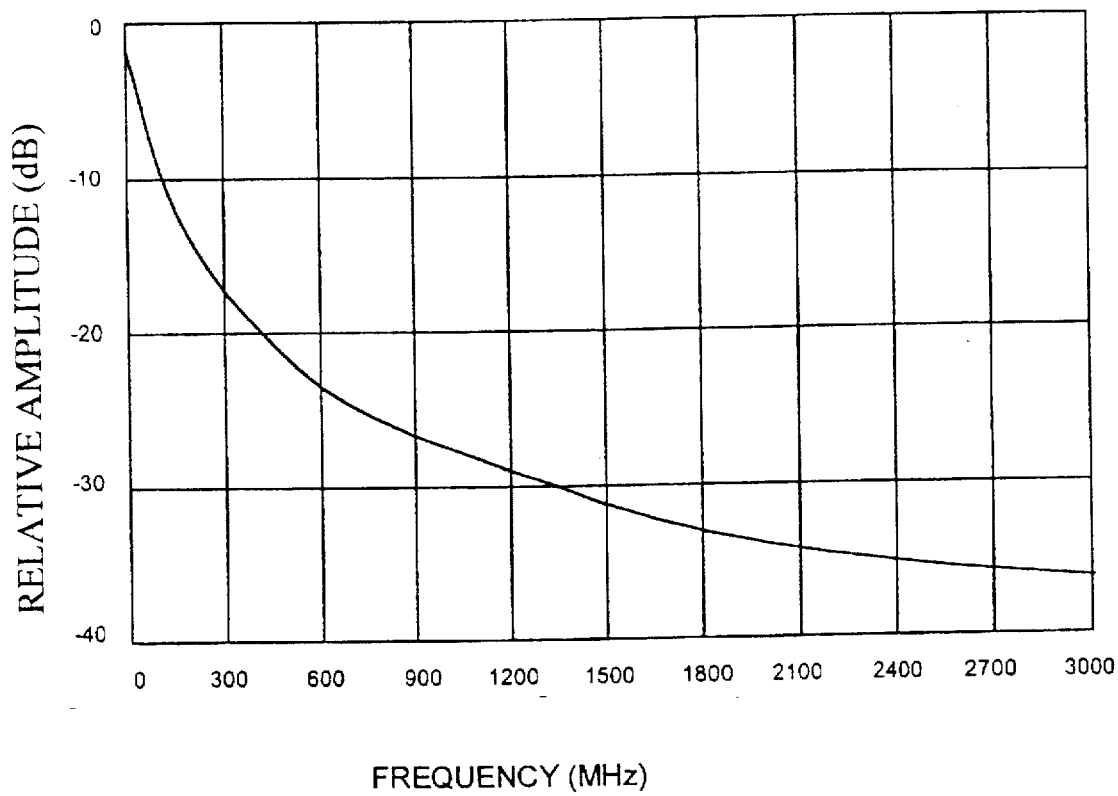
FIG. 2 shows the relative amplitude (in dB) versus frequency response curve of the ideal RC filter of FIG. 1 for the frequency range from 0 to 3 GHz.
Figure 4A:
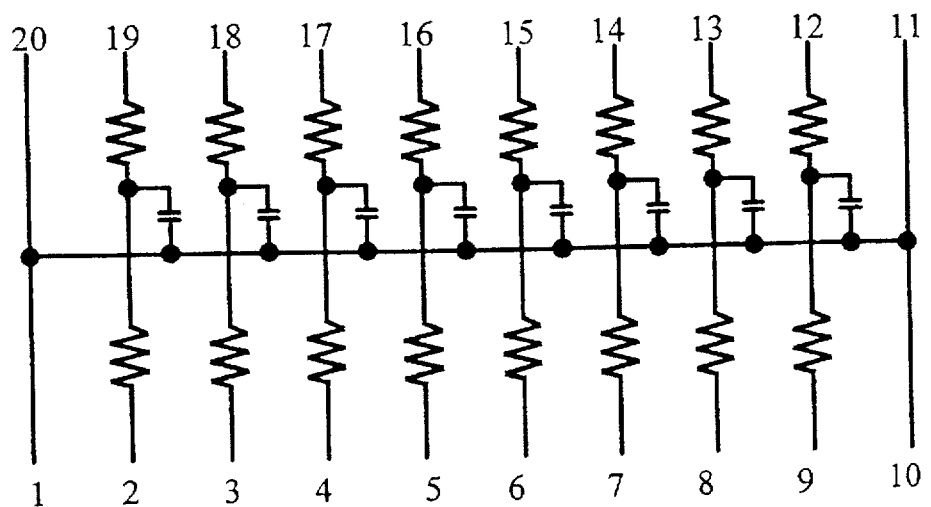
FIG. 4A schematically illustrates a prior art integrated circuit, which implements 8 integrated resistor/capacitor (IRC) filters on a 20-pin QSOP package.
Figure 4B:
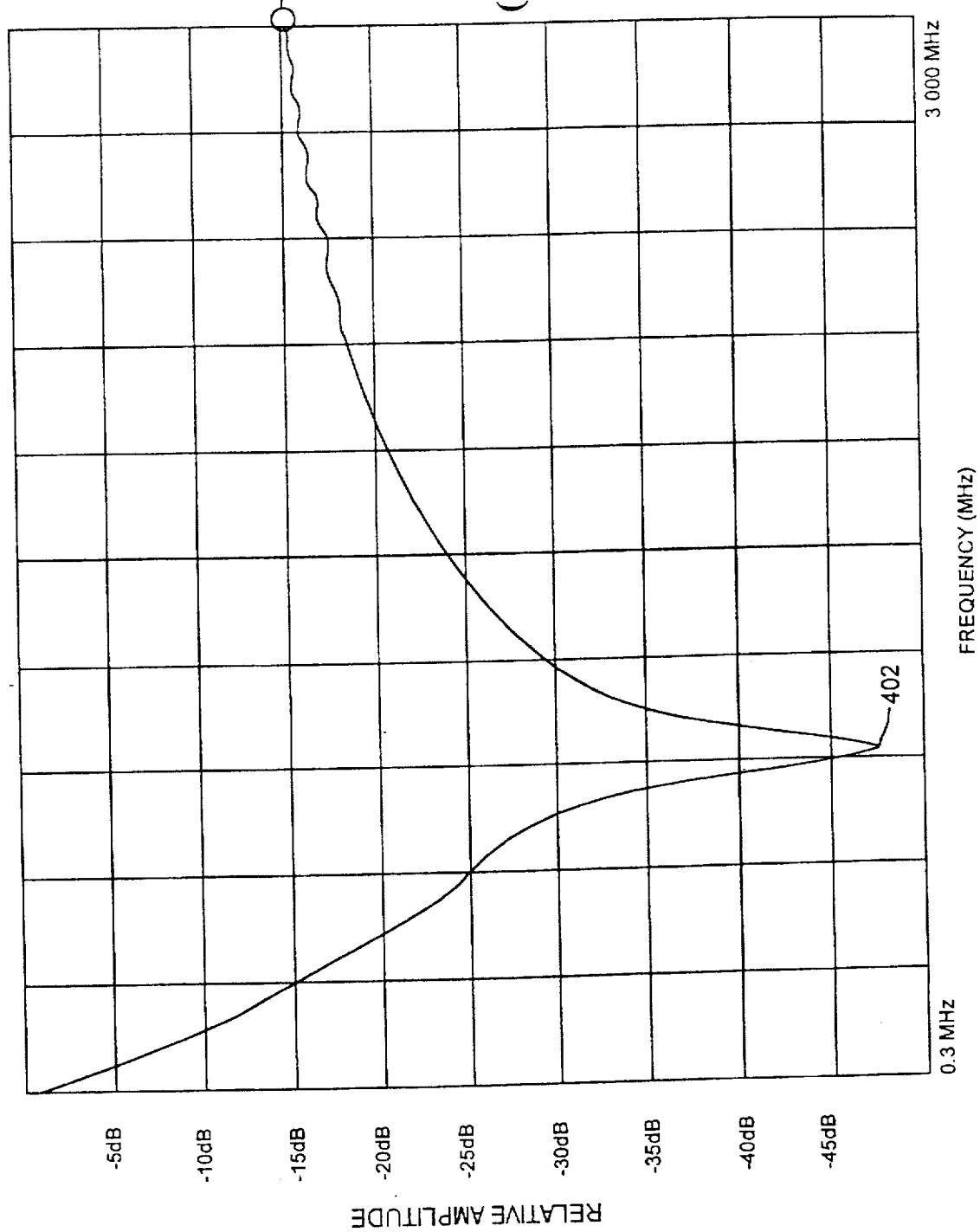

The relative amplitude versus frequency response of the integrated RC network of FIG. 4A is shown in FIG. 4B.

Figure 5A:
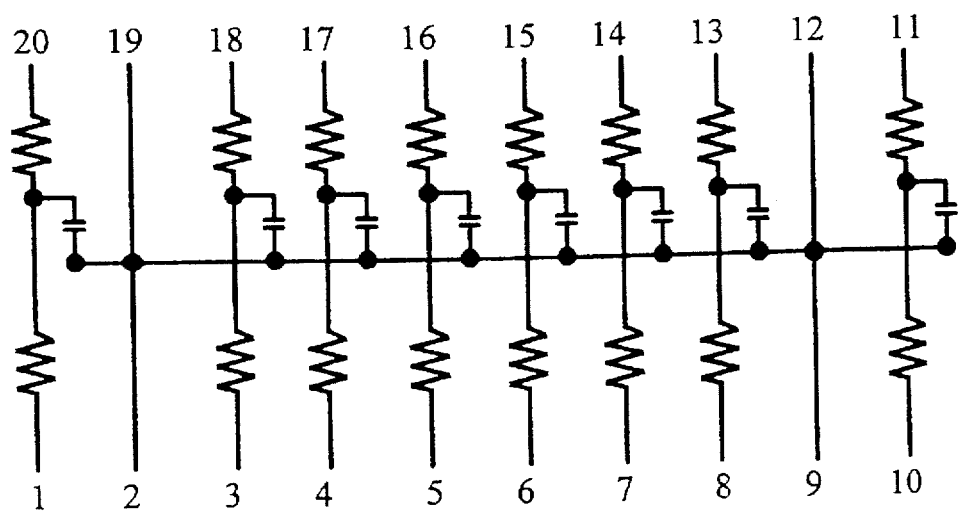

FIG. 5A illustrates, in accordance with one aspect of the present invention, a technique for improving the ultra-high frequency AFR of integrated resistor/capacitor networks that are implemented in 20-pin QSOP packages.

Figure 5B:
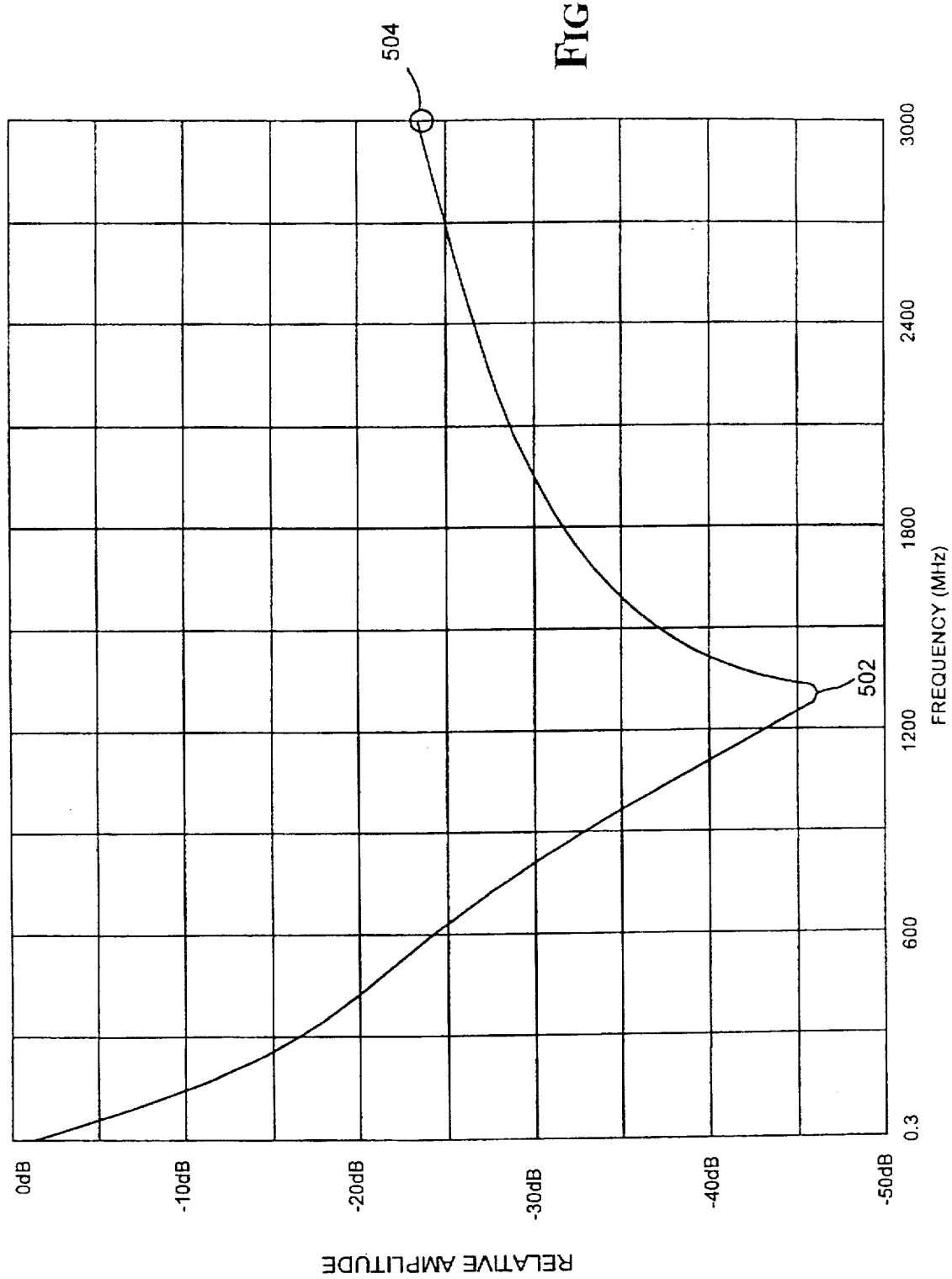

FIG. 5B. shows the AFR of the integrated RC network of FIG. 5A.

Figure 6:
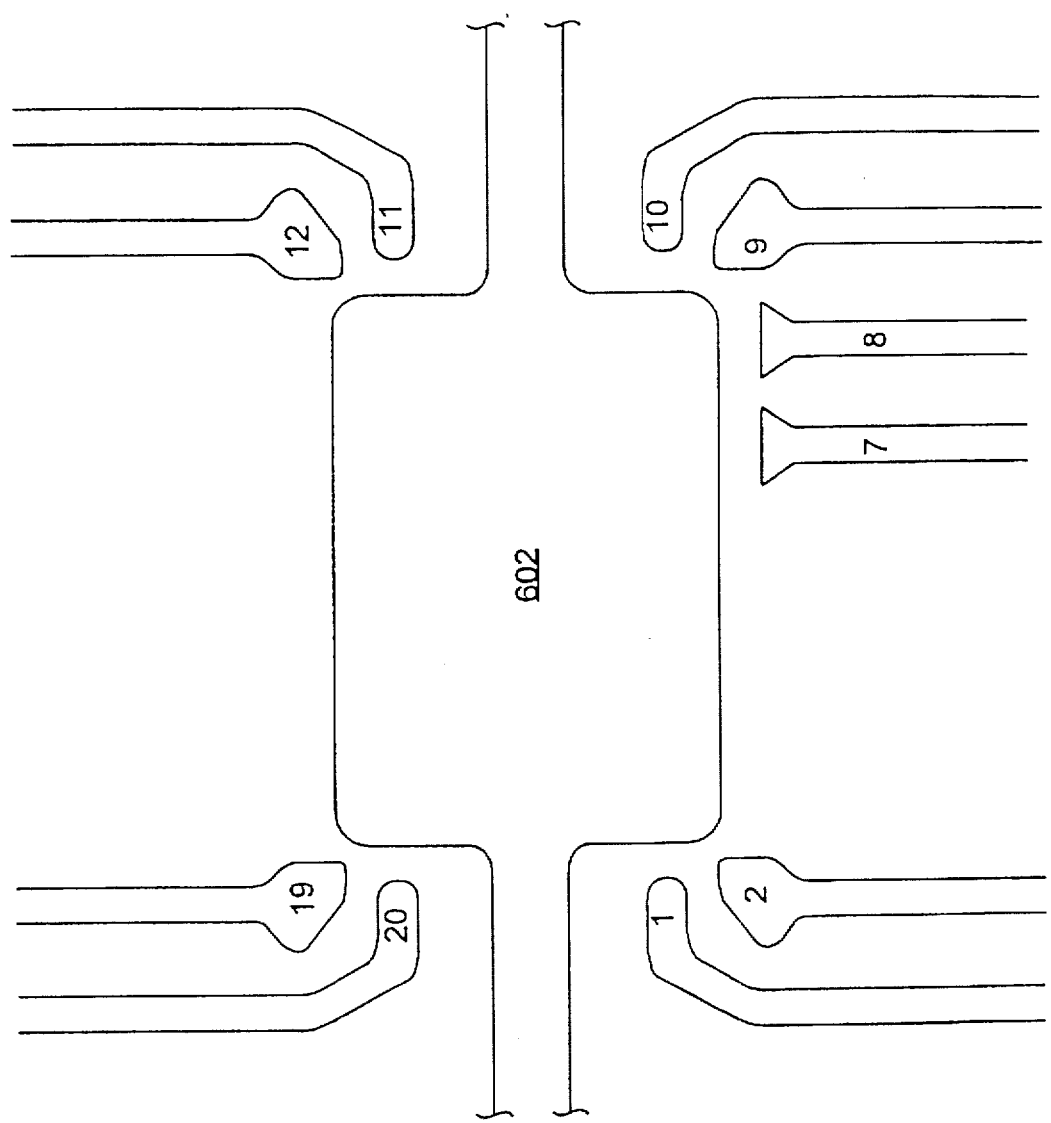

FIG. 6 illustrates the leadframe of a typical 20-pin QSOP package.

Figure 7A:
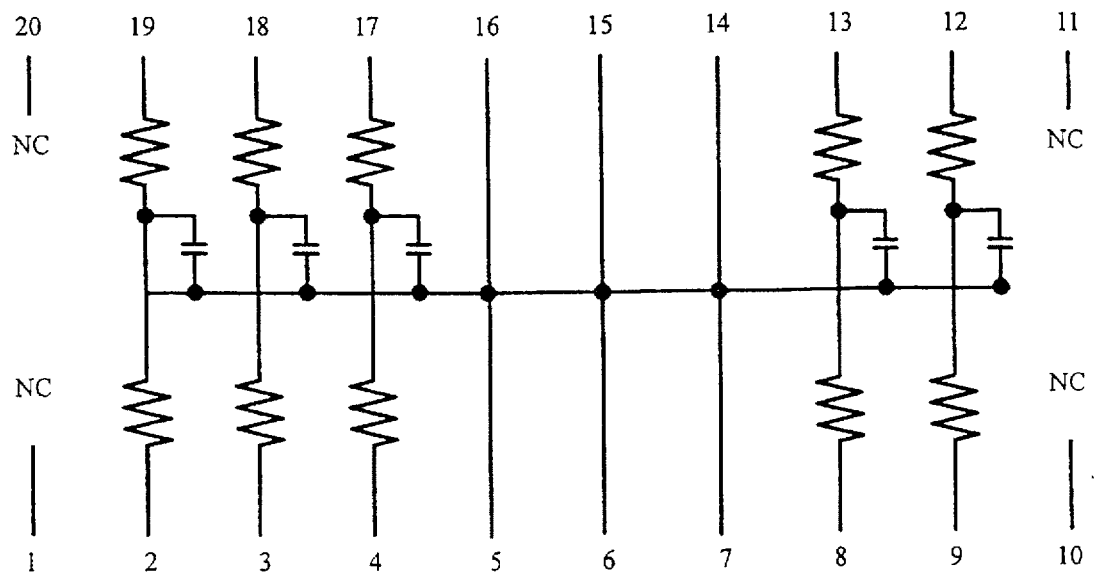

FIG. 7A illustrates an embodiment wherein pins 5, 6, 7, 14, 15, and 16 of the 20-pin QSOP package are employed as the ground pins.

Figure 7B:
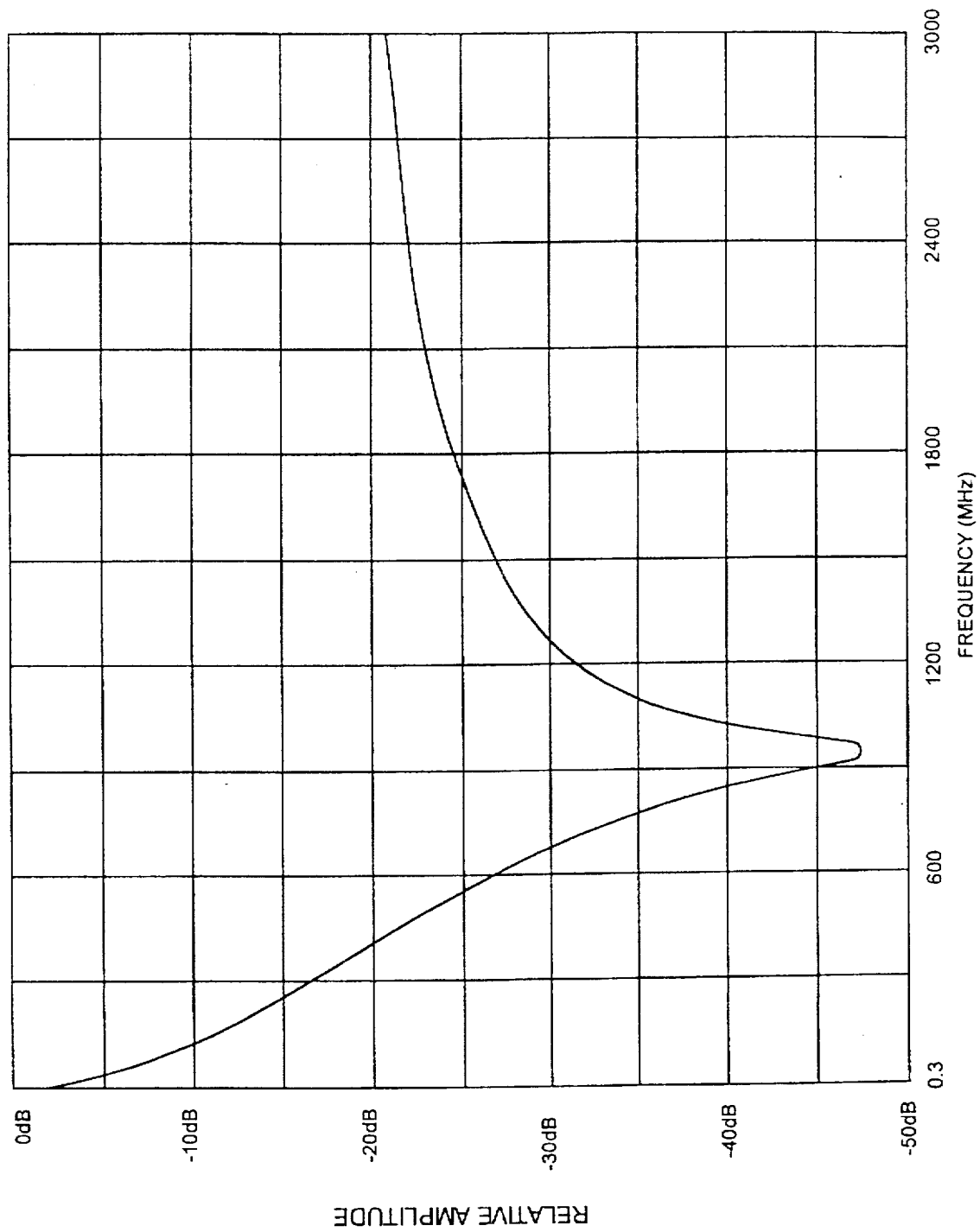

FIG. 7B shows the AFR of the integrated RC network of FIG. 7A.

Figure 8A:
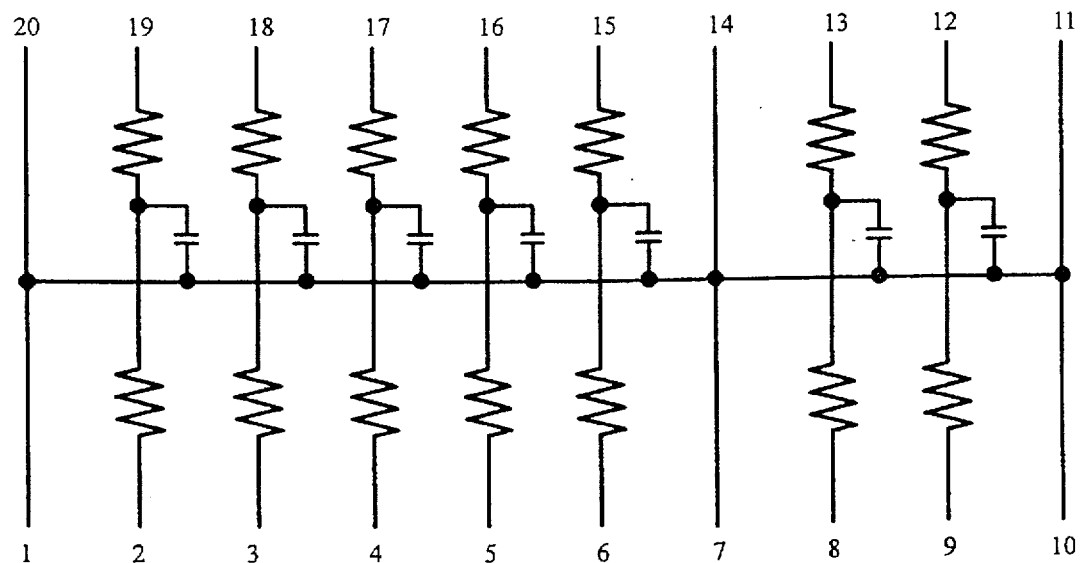

FIG. 8A illustrates in yet another embodiment of the present invention an integrated RC network wherein four of the six ground pins are corner pins of the 20-pin QSOP package.

Figure 8B:
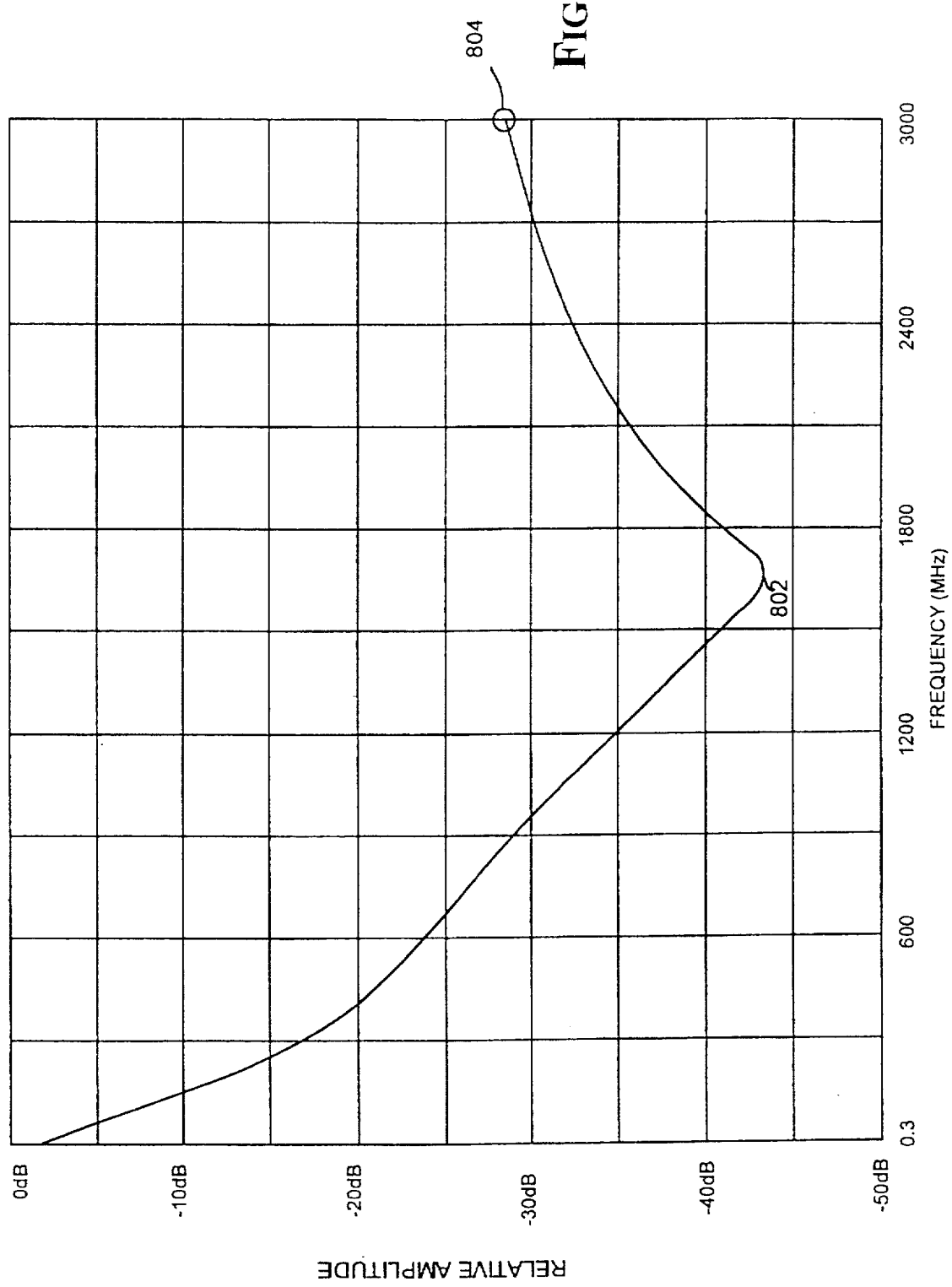

FIG. 8B is the AFR obtained for the IRC network of FIG. 8A

Figure 9A:
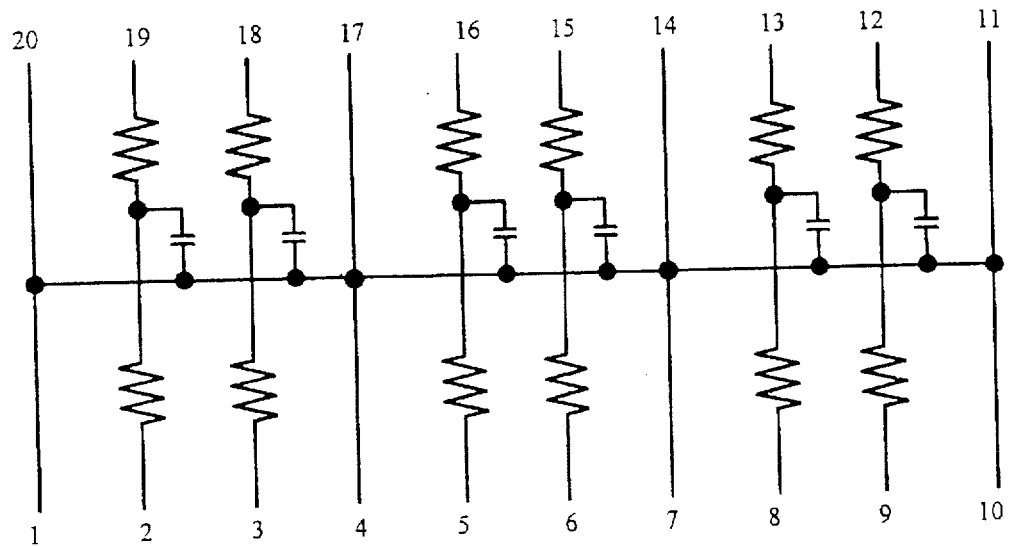

FIG. 9A illustrates in yet another embodiment of the present invention an integrated RC network wherein four of the eight ground pins are corner pins of the 20-pin QSOP package.

Figure 9B:
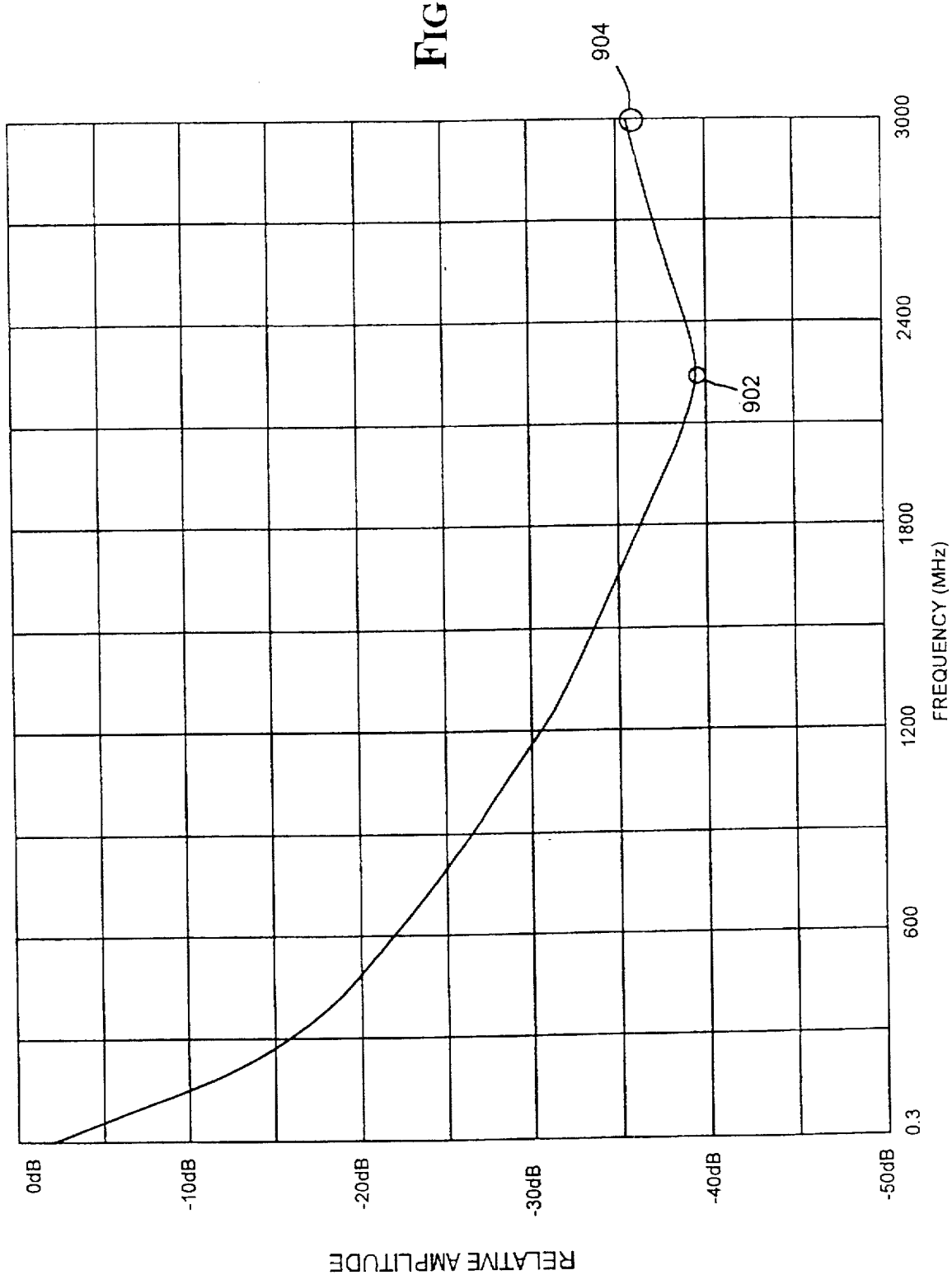

FIG. 9B is the AFR obtained for the IRC network of FIG. 9A

Figure 10A:
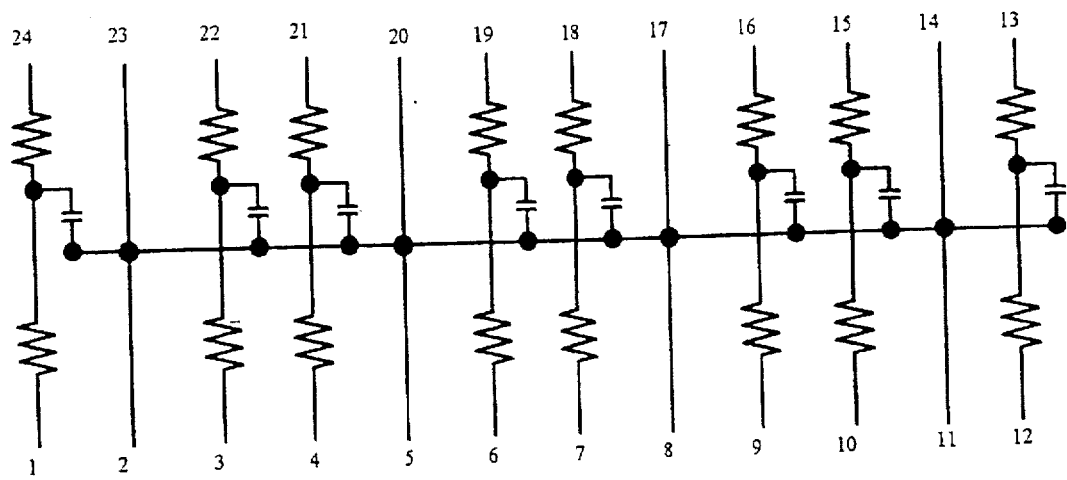

FIG. 10A illustrates in yet another embodiment of the present invention an integrated RC network which employs 8 ground pins in a 24-pin QSOP package.

Figure 10B:
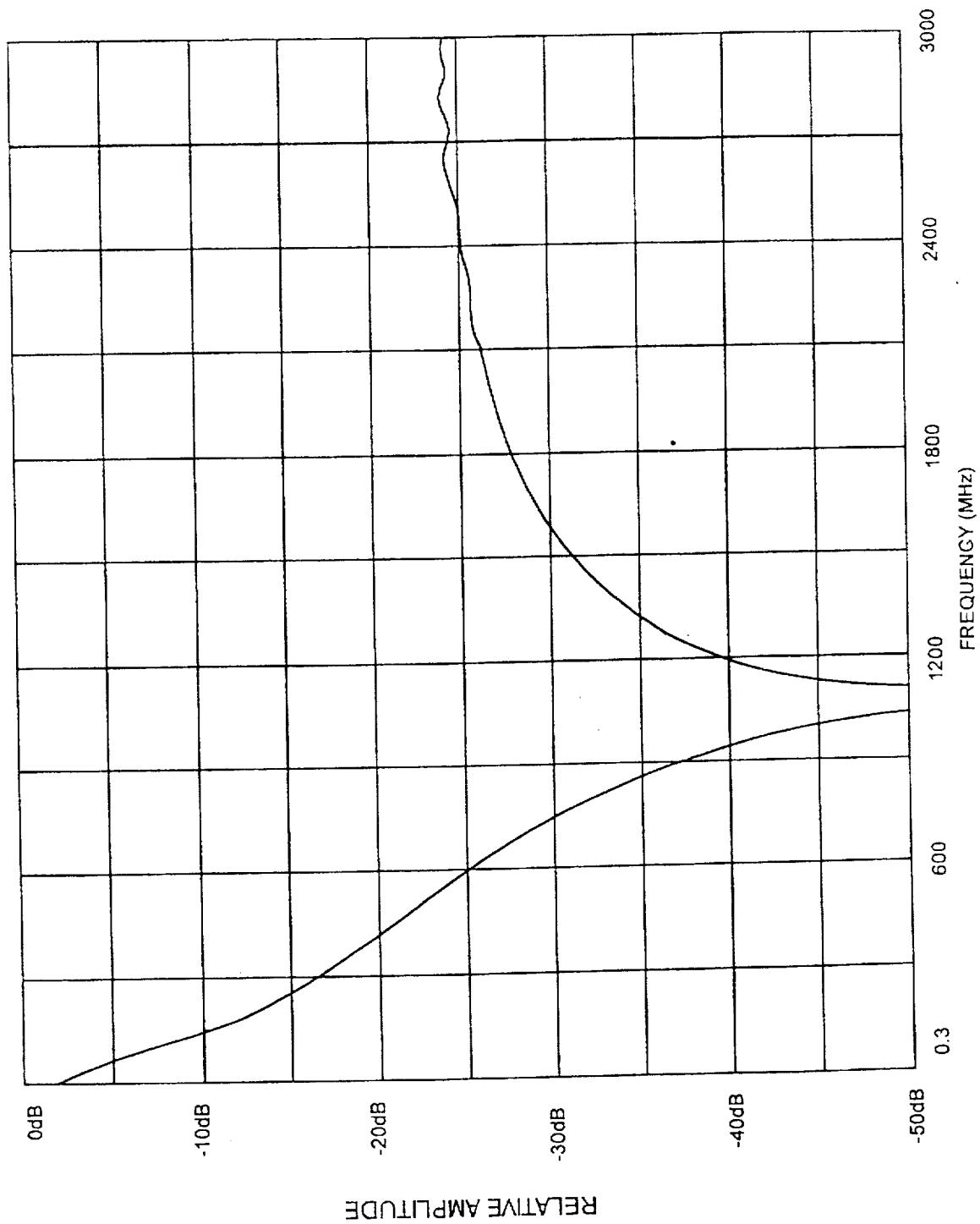

FIG. 10B shows the AFR that results when pins 2, 5, 8, 11, 14, 17, 20, and 23 are employed to ground the 24-pin QSOP IRC network, as is done in the embodiment of FIG. 10A.

Figure 11:
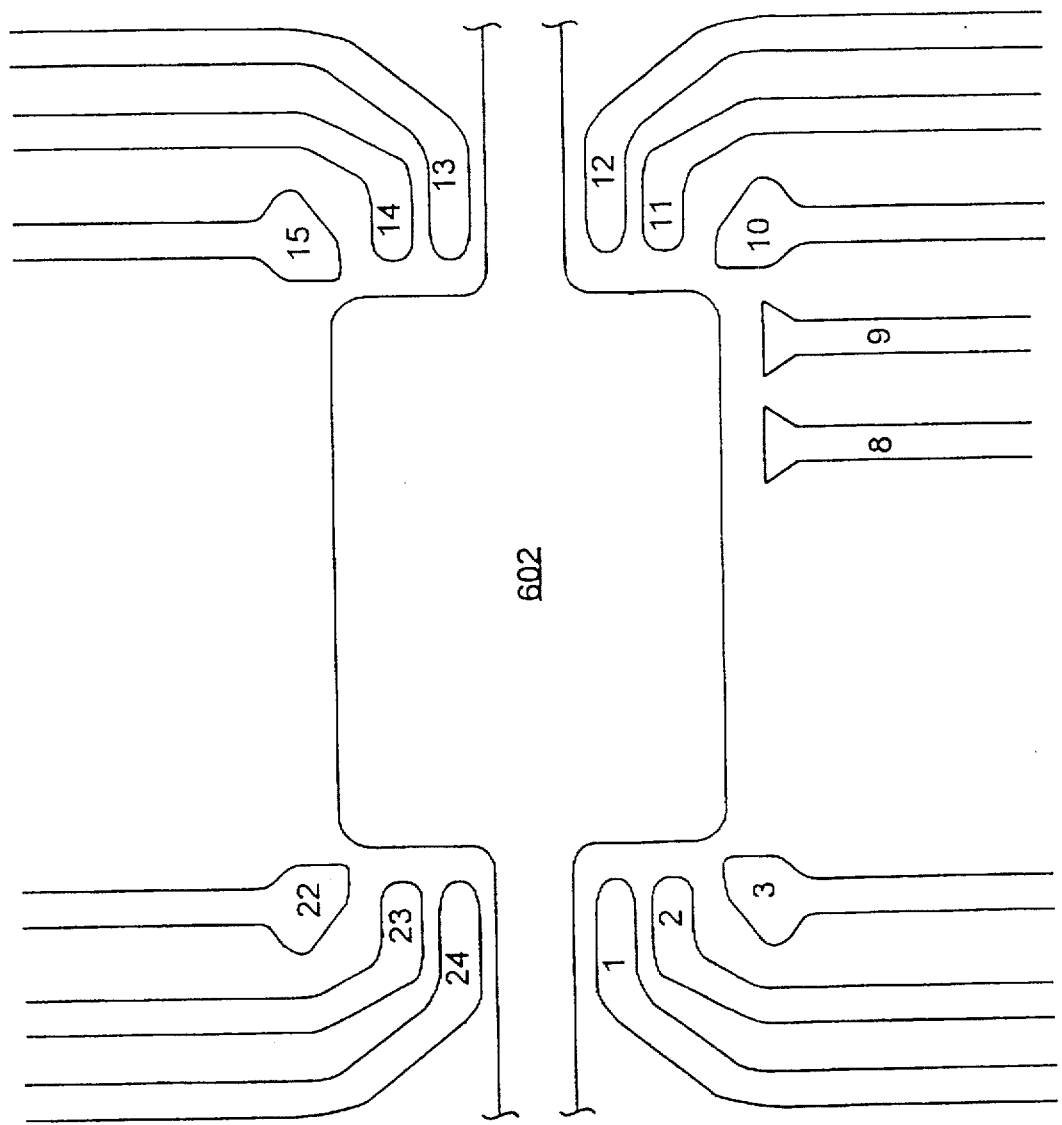

FIG. 11 shows the leadframe of a representative 24-pin QSOP package.

Figure 12A:
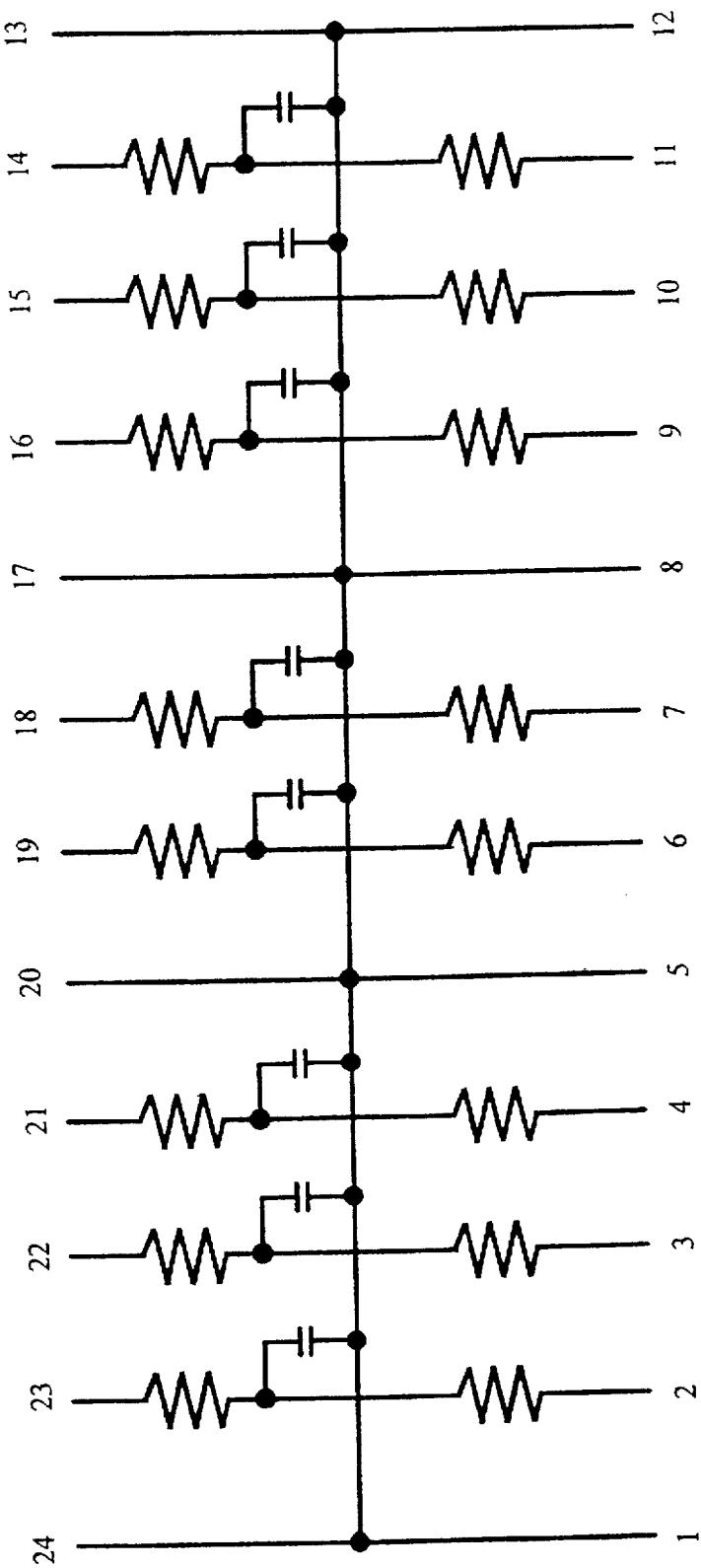

FIG. 12A illustrates yet another embodiment of the 24-pin QSOP integrated RC network wherein four of the eight ground pins are the corner pins of the QSOP package.

Figure 12B:
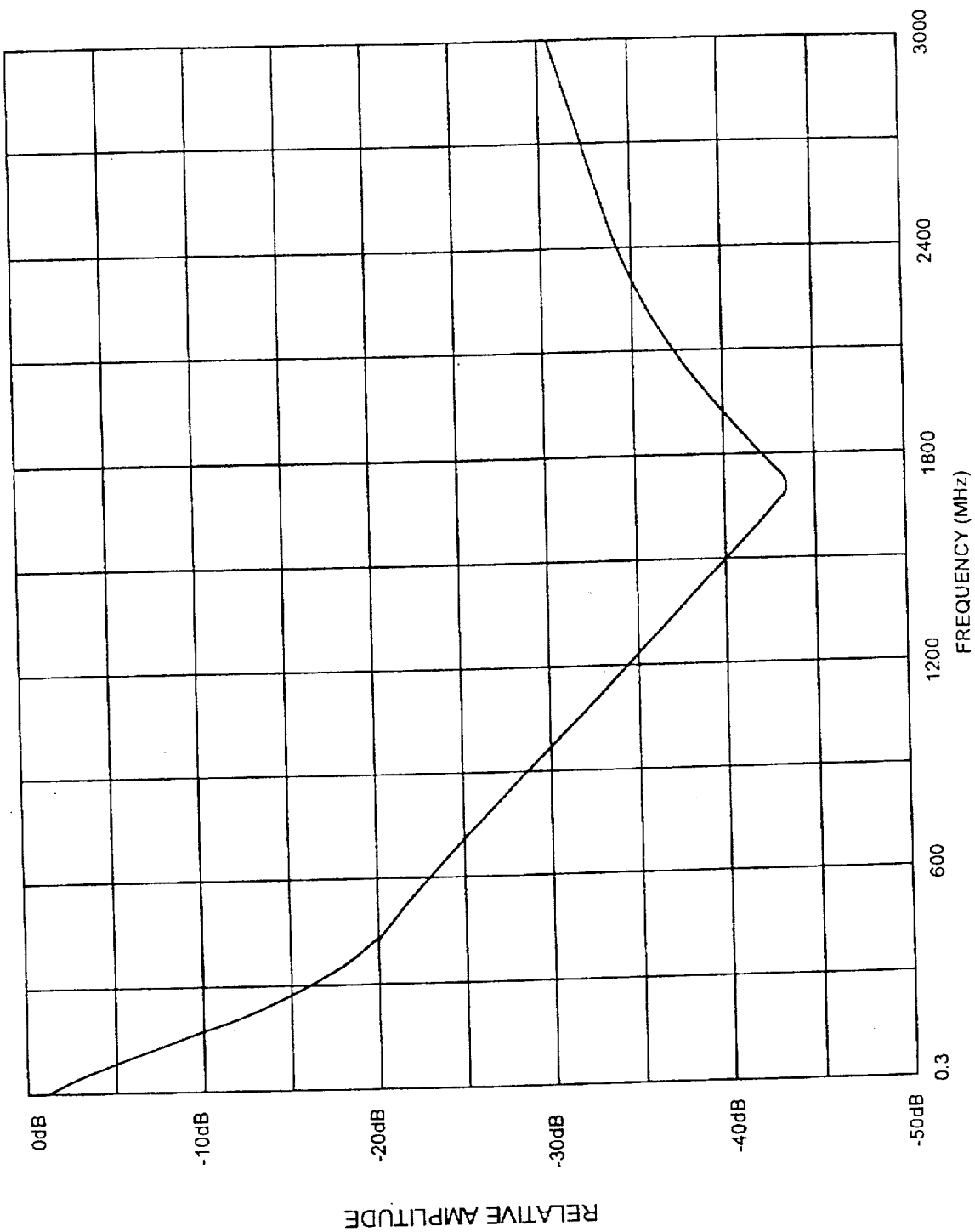

FIG. 12B shows the AFR of the IRC network of FIG. 12A.

DETAILED DESCRIPTION OF THE PREFERRED EMBODIMENTS

An invention is described for improving the AFR of integrated resistor/capacitor networks, particularly at the ultra-high frequency range. In the following description, numerous specific details are set forth in order to provide a thorough understanding of the present invention. It will be obvious, however, to one skilled in the art, that the present invention may be practiced without some or all of these specific details. In other instances, well known structures and process steps have not been described in detail in order not to unnecessarily obscure the present invention.

FIG. 5A illustrates, in accordance with one aspect of the present invention, a technique for improving the ultra-high frequency AFR of integrated resistor/capacitor networks that are implemented in 20-pin QSOP packages. In FIG. 5A, pins 2, 9, 12, and 19 are employed as the ground pins that couple to the common ground plane, i.e., the common back plane, of the integrated RC network. FIG. 5B shows the AFR of the integrated RC network of FIG. 5A taken at arbitrary test pins, e.g., pins 5 and 16. Note that the maximum rejection frequency has moved from approximately 950 MHz (point 402 of FIG. 4B) to over 1.2 GHz (point 502 of FIG. 5B). Correspondingly, the attenuation at 3 GHz is also improved, from about 15 dB at 3 GHz (point 404 of FIG. 4B), to about 25 dB at 3 GHz (point 504 of FIG. 5B).

It is speculated that the improvement in the AFR over prior art IRC network of FIG. 4A is, at least in part, a result of the reduction in the value of parasitic inductor $L_{GROUND}$. In this embodiment of the invention, the shorter pins 2, 9, 12, and 19 of the 20-pin QSOP package are advantageously employed as ground pins instead of pins 1, 10, 11, and 20 (as in the case of prior art FIG. 4A). Since the ground pins are shorter in the present embodiment of the present invention, the value of parasitic inductor $L_{GROUND}$ is correspondingly lower.

Due to the layout of the leadframe of the 20-pin QSOP package, the use of pins 2, 9, 12, and 19 as ground pins also allows the bonding wires from those pins to the pad of the leadframe to be shorter than the length of the bonding wires required when pins 1, 10, 11, and 20 are employed as ground pins (as in the case of the prior art FIG. 4A). The shorter bonding wires also contribute to the reduction in the value of parasitic inductor $L_{GROUND}$.

The discussion of the leadframe of a typical 20-pin QSOP package relative to the semiconductor die is now made with reference to FIG. 6. As clearly shown therein, pins 2, 9, 12, and 19, which are employed as ground pins in the inventive IRC configuration of FIG. 5A, are shorter than pins 1, 10, 11, and 20, which are employed as ground pins in the prior art IRC of FIG. 4A. Further, the total length of the bonding wires between pins 2, 9, 12, and 19 to the pad of the leadframe are also shorter than the total length of the bonding wires from pins 1, 10, 11, and 20 to their respective bonding pads on die 602. As mentioned earlier, the shorter pins and shorter bonding wires result in a smaller inductance value for parasitic inductor $L_{GROUND}$ thereby improving the frequency response of the IRC network of FIG. 5A at the ultra-high frequency range, e.g., above 1 GHz.

In the embodiment of FIG. 7A, pins 5, 6, 7, 14, 15, and 16 are employed as the ground pins that couple each RC filter to the common ground plane of the integrated RC network. The semiconductor die employed in this embodiment is substantially similar to that employed in the embodiment of FIG. 5A, and is indeed substantially similar to the dies employed the other IRC's described herein. Since the dies employed in the other IRC's described herein are substantially similar, the frequency response effect attributed to the die can be ruled out when comparing the AFR's of the various embodiments.

With reference to the QSOP diagram of FIG. 6, it can be seen any of these pins 5, 6, 7, 14, 15, and 16 is shorter than any of pins 2, 9, 12, and 19, which are employed as the ground pins in the IRC network of FIG. 5A. Consequently, it is expected that the frequency response at the ultra-high frequency range should improve due to the expected reduction in the value of parasitic capacitance $L_{GROUND}$. Further, since six pins are employed as ground pins in the embodiment of FIG. 7A, it is expected that the effective inductance that contributes to $L_{GROUND}$ would be less than that associated with the four ground pins of FIG. 5A (due to the nature of inductors in parallel).

Surprisingly, the amplitude versus frequency response plot of FIG. 7B, which is obtained at arbitrary test pins, e.g., pins 2 and 19, shows that the maximum rejection frequency is worse, i.e., about 915 MHz in FIG. 7B (versus over 1.2 GHz in FIG. 5B). Further, while the attenuation of about 21 dB at 3 GHz in FIG. 7B is an improvement over the 15 dB attenuation achieved by the prior art IRC of FIGS. 4A and 4B, it is substantially below the 24 dB of attenuation seen in the embodiment of FIGS. 5A and 5B. The AFR result shown in FIG. 7B, being counter to expectation, is therefore surprising and serves to illustrate the unpredictable nature of the frequency response of IRC's in the higher frequency ranges. As the drawing indicates, pins 1, 10, 11, 20 are not connected in FIG. 7 to simplify the experiment.

In the embodiment of FIG. 8A, six pins are again employed as ground pins. However, the six ground pins of FIG. 8A now include the four corner pins, i.e., pins 1, 10, 11, and 20 of the 20-pin QSOP package. The two other ground pins are arranged in equal numbers on opposite sides of the QSOP package. In the embodiment of FIG. 7A, they are pins 7 and 14. With reference to the QSOP schematic of FIG. 6, the total length of the six ground pins employed in the IRC configuration of FIG. 8A is longer than the total length of the six ground pins employed in the IRC configuration of FIG. 7A. Therefore, one would expect that the inductance associated with parasitic inductor $L_{GROUND}$ would increase and the attenuation of the IRC configuration of FIG. 8A would be worse at the higher frequency ranges than that associated with the embodiment of FIG. 7A.

FIG. 8B is the AFR obtained from arbitrary test pins, e.g., pins 5 and 16 of FIG. 8A. Unexpectedly, the attenuation at 3 GHz is better (about 28 dB) than that seen in FIG. 7B (about 21 dB). Also, the maximum rejection frequency at point 802 of FIG. 8B (above about 1.6 GHz) is an improvement over that of FIG. 7B (about 915 MHz). This unexpected result again illustrates the unpredictable nature of the frequency response of the IRC networks at the high frequency ranges.

In FIG. 9A, eight pins are employed to ground the IRC network. The eight ground pins include the four corner pins of the 20-pin QSOP package, i.e., pins 1, 10, 11, and 20. The four other ground pins are arranged in equal numbers on opposite sides of the QSOP package. In the embodiment of FIG. 9A, they are implemented by pins 4, 7, 14, and 17. In this configuration, it is expected that the parasitic inductance associated with parasitic inductor $L_{GROUND}$ would be substantially less than that of prior art FIG. 4A, since there are more inductors in parallel to reduce the effective inductance contributed by the ground pins.

FIG. 9B illustrates the relative amplitude versus frequency response of the integrated resistor/capacitor network of FIG. 9A. In FIG. 9B, the maximum rejection frequency at point 902 is shown to be over about 2 GHz, and the attenuation at 3 GHz is about 36 dB. Clearly, this result represents a significant improvement over the prior art configuration of FIG. 4A.

The configuration shown in FIG. 9A also has routing advantages when the IC package that implements the integrated resistor/capacitor network of FIG. 9A is placed on the circuit board. This is because the RC filters are coupled in pairs, and the terminals to each pair are separated and isolated from the terminals of other pairs by ground pins. It is contemplated that changes to the locations of the interior ground pins, i.e., those not disposed at the corners of the QSOP package, may be made without significantly impacting the frequency response of the resulting IRC configurations. By way of example, changing the ground pins from pin 4 to pin 2 or from pin 7 to pin 8 may not have a significant impact on the frequency response as long as the corner pins of the 20-pin QSOP package, i.e., pins 1, 10, 11, and 20, are still employed as four of the eight ground pins.

Although the IRC configuration of FIG. 9A results in a significantly improved AFR at the ultra-high frequency range, the use of eight pins out of twenty as ground pins in a 20-pin QSOP package leaves only twelve pins remaining to implement the RC filters. As a result, the maximum number of RC filters that can be achieved in this embodiment is six. In FIG. 10A, a 24-pin QSOP package is advantageously employed to increase the number of filters that can be implemented when more than four pins are employed as ground pins.

FIG. 10B shows the AFR that results when pins 2, 5, 8, 11, 14, 17, 20, and 23 are employed to ground the 24-pin QSOP IRC network, as is done in the embodiment of FIG. 10A. As can be seen, the attenuation is about 24 dB at 3 GHz, and the rejection frequency is about 1 GHz at test pin 1 and test pin 12. In this case, pins 1 and 12 represent the pins where the frequency response appears to be the worst. Note that the frequency response at 3 GHz in FIG. 10B is about the same as that obtained by the configuration of FIG. 5A, i.e., about 24 dB. This is surprising, since these configurations are similar, e.g., neither employ corner pins as ground pins, and one would expect that the effective inductance associated with eight pins in parallel would be less than that associated with four pins in parallel. It is therefore expected that the embodiment of FIG. 10A would have an improved frequency response at the 3 GHz range. Nevertheless, the AFR indicates otherwise, and this fact again highlights the unpredictable nature of the frequency response of IRC networks at the high frequency ranges.

FIG. 11 shows the leadframe of a representative 24-pin QSOP package to facilitate understanding. Note that the 24-pin QSOP package occupies substantially the same footprint as the 20-pin QSOP package. Thus, the use of a 24-pin QSOP package to implement IRC's is particularly advantageous since it can accommodate more filters per IC without taking up additional room on the circuit board.

FIG. 12A illustrates, in one embodiment of the invention, a novel IRC network configuration wherein four of the eight ground pins are the corner pins of the 24-pin QSOP package, i.e., pins 1, 12, 13, and 24. The other four ground pins are arranged in equal numbers on opposite sides of the QSOP package. In the embodiment of FIG. 12A, they are pins 5, 8, 17, and 20. However, it is contemplated that changes to the locations of the interior ground pins, i.e., those not disposed at the corners of the QSOP package, may be made without significantly impacting the frequency response of the resulting IRC configurations. By way of example, changing the ground pins from pin 5 to pin 4 or from pin 17 to pin 16 may not have a significant impact on the frequency response as long as the corner pins of the 24-pin QSOP package, i.e., pins 1, 12, 13, and 24 are still employed as four of the eight ground pins.

FIG. 12B shows the AFR of the IRC network of FIG. 12A. In FIG. 12B, the maximum rejection frequency is shown to be almost 1.8 GHz, and the attenuation at 3 GHz is about 31 dB. This is clearly an improvement over the results obtained in FIG. 10B. This is surprising, since the ground pins in FIG. 12A are longer than those employed in FIG. 10A, and since the same number of pins, i.e., eight, are employed to ground the IRC networks, one would expect that the effective inductance associated with the IRC network of FIG. 12A would be larger than that associated with the IRC network of FIG. 10A. Nevertheless, FIG. 12B shows that the frequency response is improved.

In both FIG. 12A and FIG. 9A, the corner pins are employed as ground pins. The use of corner pins of the QSOP package, irrespective whether the QSOP package has 20 pins or 24 pins, appears to provide the best AFR when combined with additional ground pins in between. These results appear to be true although these corner pins are longer than other non-corner pins in the QSOP package. Further, the attenuation at 3 GHz for the IRC network of FIG. 12A is somewhat worse than that associated with the IRC network of FIG. 9A. This is surprising, since both QSOP IRC packages employ the same number of pins, employ four corner pins to ground their IRC networks, and they both have approximately the same footprint on the circuit board. Although the frequency response of the embodiment shown in FIG. 12A is slightly worse than that of FIG. 9A, the use of the 24-pin QSOP package advantageously allows the designer to put eight RC filters in the same amount of space while still achieving an attenuation of above 30 dB at 3 GHz.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In an integrated resistor/capacitor network implemented in a Quarter Size Small Outline Package (QSOP) package, a method for improving the attenuation of ultra-high frequency signals filtered through resistor/capacitor filters of said integrated resistor/capacitor network, said method comprising the step of employing at least six pins of said QSOP package as ground pins for said integrated resistor/capacitor network, wherein at least two non-ground pins of said integrated resistor/capacitor network are disposed adjacent to one another without one of said ground Pins disposed in between.

2. The method of claim 1 wherein said employing includes using four of said ground pins as corner pins of said QSOP package.

3. The method of claim 2 wherein said employing further includes using a first two additional pins as ground pins, said first two additional pins being disposed on opposite sides of said QSOP package.

4. The method of claim 3 said employing further includes using a second two additional pins as ground pins, said two additional pins being disposed on said opposite sides of said QSOP package.

5. The method of claim 2 wherein said QSOP package represents a 20-pin QSOP package and said corner pins are pins 1, 10, 11, and 20.

6. The method of claim 5 wherein a first additional two of said ground pins consists of pins 7 and 14.

7. The method of claim 6 wherein a second additional two of said ground pins consists of pins 4 and 17.

8. The method of claim 2 wherein said QSOP package represents a 24-pin QSOP package and said corner pins are pins 1, 12, 13, and 24.

9. The method of claim 8 wherein a first additional two of said ground pins consists of pins 5 and 20.

10. The method of claim 9 wherein a second additional two of said ground pins consists of pins 8 and 17.

11. A Quarter Size Small Outline Package (QSOP) integrated resistor/capacitor network, said QSOP integrated resistor/capacitor network comprising resistor/capacitor filters implemented in a QSOP package in integrated form, said QSOP integrated resistor/capacitor network comprising at least six ground pins for coupling capacitors of said resistor/capacitor filters with a common ground to improve the attenuation of ultra-high frequency signals filtered through said resistor/capacitor filters, wherein at least two non-around pins of said integrated resistor/capacitor network are disposed adjacent to one another without one of said ground pins disposed in between.

12. The QSOP integrated resistor/capacitor network of claim 11 wherein four of said ground pins are corner pins of said QSOP package.

13. The QSOP integrated resistor/capacitor network of claim 12 further comprising a first two additional pins, said first two additional pins being disposed on opposite sides of said QSOP package.

14. The QSOP integrated resistor/capacitor network of claim 13 further comprising a second two additional pins, said two additional pins being disposed on said opposite sides of said QSOP package.

15. The QSOP integrated resistor/capacitor network of claim 12 wherein said QSOP package represents a 20-pin QSOP package and said corner pins are pins 1, 10, 11, and 20.

16. The QSOP integrated resistor/capacitor network of claim 15 wherein a first additional two of said ground pins consists of pins 7 and 14.

17. The QSOP integrated resistor/capacitor network of claim 16 wherein a second additional two of said ground pins consists of pins 4 and 17.

18. The QSOP integrated resistor/capacitor network of claim 12 wherein said QSOP package represents a 24-pin QSOP package and said corner pins are pins 1, 12, 13, and 24.

19. The QSOP integrated resistor/capacitor network of claim 18 wherein a first additional two of said ground pins consists of pins 5 and 20.

20. The QSOP integrated resistor/capacitor network of claim 19 wherein a second additional two of said ground pins consists of pins 8 and 17.

* * * * *

UNITED STATES PATENT AND TRADEMARK OFFICE
CERTIFICATE OF CORRECTION

PATENT NO. : 5,760,662

DATED : June 2, 1998

INVENTOR(S) : Kalb et al.

It is certified that error appears in the above-identified patent and that said Letters Patent is hereby corrected as shown below:

Column 5, line 25, insert --,-- after "GROUND"
Column 7, line 13, change "1O" to --10--
Column 8, line 25, change "Pins" to --pins--
Column 8, line 33, change "emploving" to --employing--
Column 8, line 60, change "non-around" to --non-ground--

Signed and Sealed this

Third Day of November, 1998

Attest:

BRUCE LEHMAN

Attesting Officer

Commissioner of Patents and Trademarks